United States Patent [19]

Klein

[11] 4,151,631

[45] May 1, 1979

[54] METHOD OF MANUFACTURING SI GATE MOS INTEGRATED CIRCUIT

[75] Inventor: Thomas Klein, Saratoga, Calif.

[73] Assignee: National Semiconductor Corporation, Santa Clara, Calif.

[21] Appl. No.: 798,215

[22] Filed: May 18, 1977

Related U.S. Application Data

[63] Continuation-in-part of Ser. No. 725,230, Sep. 22, 1976, abandoned.

[51] Int. Cl.² ............................................. B01J 17/00
[52] U.S. Cl. ........................................ 29/571; 29/578; 148/188; 357/59
[58] Field of Search .................. 29/571, 578; 148/188; 357/59

[56] References Cited

U.S. PATENT DOCUMENTS

| | | | |
|---|---|---|---|
| 3,958,323 | 5/1976 | De La Moneda | 357/59 |
| 4,035,829 | 7/1977 | Ipri | 357/59 |

Primary Examiner—W. Tupman

Attorney, Agent, or Firm—Gail W. Woodward

[57] ABSTRACT

An IC manufacturing method that eliminates the need for separate pad area and allows polysilicon MOS transistor gates to be contacted directly. Present silicon gate process techniques are utilized up to and including the formation of the gate oxide layer, with areas etched through to the substrate. Then polysilicon and silicon nitride are deposited preferably in the same deposition equipment. The polysilicon interconnect and gate pattern is selectively etched for both silicon nitride and polysilicon. Next, the gate oxide exposed by the previous step is removed and phosphorous is diffused into the exposed silicon substrate surfaces. The initial nitride thickness is chosen such that after phosphorous predeposition and subsequent removal of phosphorous glass, a thin layer of silicon nitride is left. A silicon oxide protective layer is then grown over the exposed silicon substrate surfaces. The remaining silicon nitride is removed and a phosphosilicate glass is deposited over the entire surface. Contact cuts are made through the phosphosilicate glass through which metal contacts are established.

5 Claims, 9 Drawing Figures

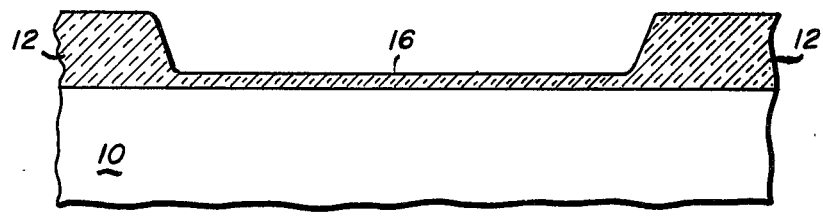
Fig_1
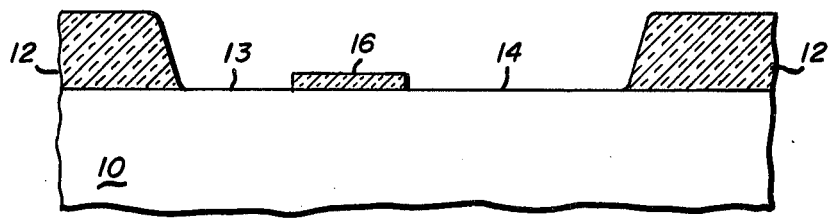
Fig_2
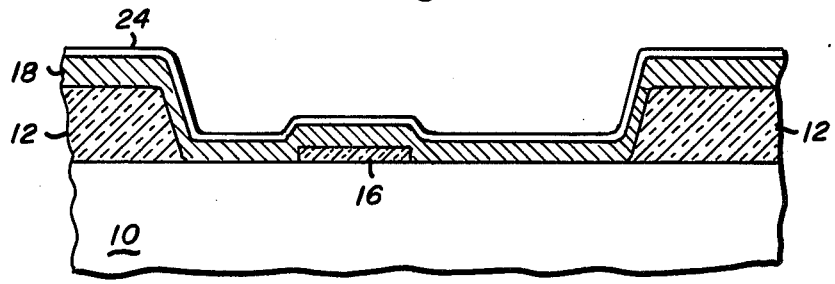
Fig_3
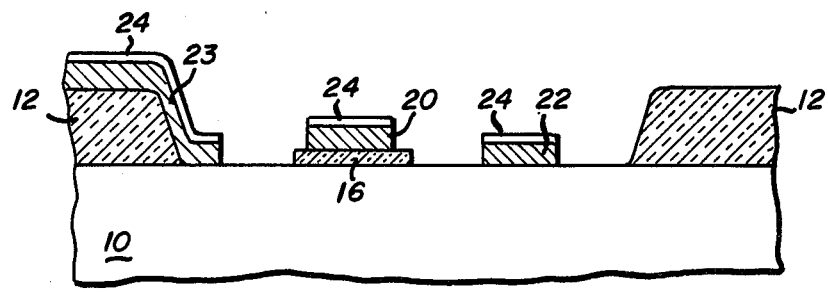
Fig_4
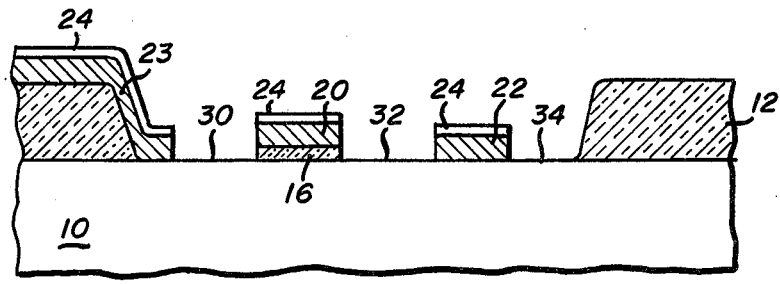
Fig_5

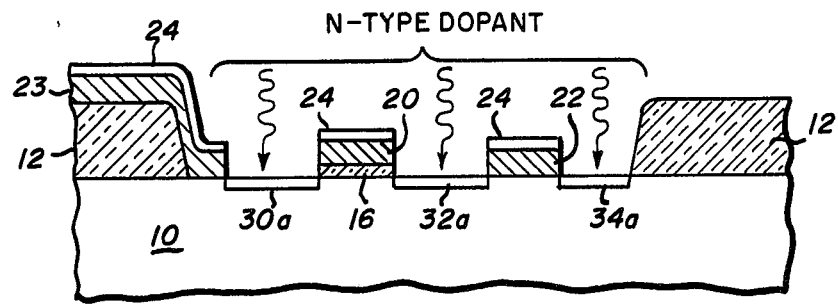
Fig_6
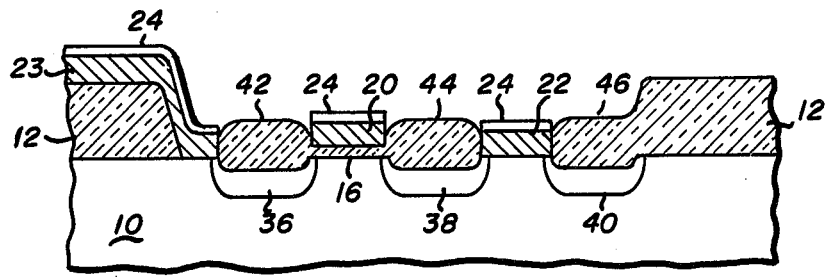
Fig_7
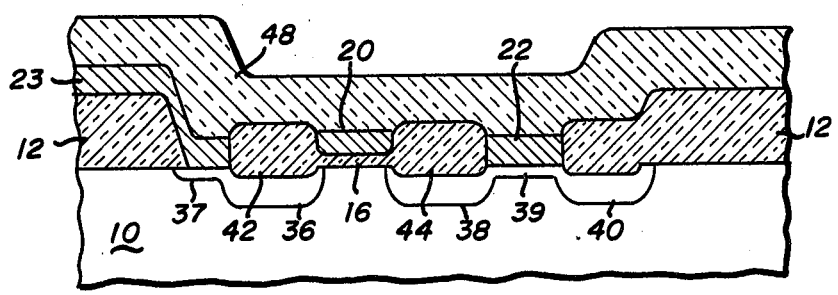
Fig_8
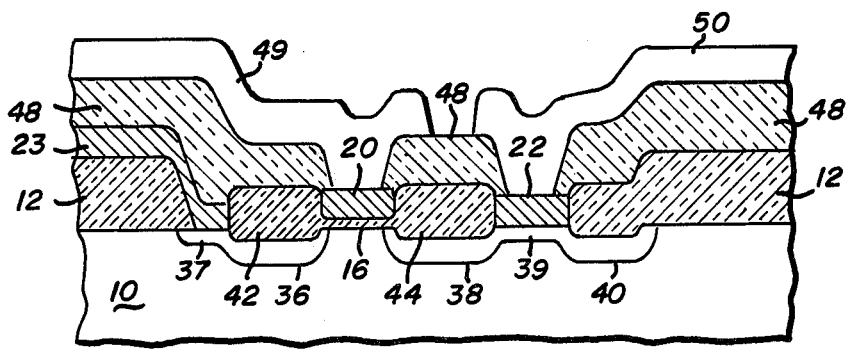
Fig_9

METHOD OF MANUFACTURING SI GATE MOS INTEGRATED CIRCUIT

BACKGROUND OF THE INVENTION

This application is a continuation-in-part of application Ser. No. 725,230, filed Sept. 22, 1976, now abandoned.

The invention relates to integrated circuit technology and the manufacturing of integrated circuits, and more particularly to a method of making metal contact with polysilicon gates and electrodes in a silicon gate MOS integrated circuit.

Prior self-aligning silicon gate MOS integrated circuits required a separate polysilicon pad outside the active device area in order to form the contact between polysilicon and the metal interconnect layer. This pad must be formed separately because the polysilicon gates are often only 0.2 to 0.25 mil wide and adjacent to the source and drain areas. If an attempt is made to contact the gates with usual photomasking technology, the gates will often be shorted to either the source or drain, or both. This is because the photomasking techniques have a resolution which is of the same magnitude as the size of the gates.

In addition, the prior art integrated circuits include a final metallization that typically comes into contact with the single crystal silicon in source and drain regions. In order to prevent excessive penetration of metal into the silicon, potentially shorting the junction to the substrate, a metallization system is used that has low silicon solubility. For example aluminum with about 2% silicon can be used. While this approach is useful, it requires maintaining an alloy deposition system and therefore introduces undesired processing complexity.

As the density of integrated circuits becomes higher, forming the outside contact pad creates a space problem. The pad area together with the spacings required in between approach 30% to 40% of the total circuit area. Accordingly area economies are desirable.

SUMMARY OF THE INVENTION

It is a primary object of this invention to eliminate the need for a separate gate pad area in manufacturing silicon gate MOS integrated circuits.

It is a further object of the invention to provide polysilicon contacts for the source and drain regions of polysilicon gate transistors so that subsequent metallization need only contact polysilicon.

It is a still further object of the invention to provide a polysilicon gate transistor manufacturing process in which polysilicon source and drain contacts along with the gate are overcoated with a phosphosilicate glass through which all metal contacts are made.

The above and other objects are accomplished in accordance with the invention by depositing a thin layer of silicon nitride immediately after deposition of polysilicon in the normal silicon gate fabrication process. A polysilicon gate and interconnect pattern is etched in the silicon nitride and polysilicon layers. The gate oxide thusly exposed is removed to provide automatic gate alignment and phosphorus is predeposited into the exposed silicon substrate areas. Next, a protective silicon oxide layer is grown over the exposed substrate areas which have been previously predeposited. No oxide grows on the top of the polysilicon gate and interconnect pattern because they are protected by the silicon nitride layer. During the oxide growth the predeposited contacts are diffused into the substrate. The silicon nitride layer can then be removed, and the contacts made to the polysilicon where desired without taking care to avoid overlapping into the substrate area since the substrate is protected by the grown silicon oxide layer.

After silicon nitride removal, the wafer is overcoated with a layer of phosphosilicate glass (PSG) which is heated to cause it to flow into a smooth overcoat. This PSG not only provides a smooth surface, it getters undesired impurities from the wafer during the heating step. Additionally, the polysilicon gates and electrode contacts are doped with phosphorous to render the polysilicon highly conductive. Contact holes are then etched through the PSG layer over selected areas of the polysilicon gate and interconnect pattern and aluminum metallization applied and etched back to define the final interconnect pattern.

The invention has the advantage that separate polysilicon gate pads outside the active device substrate areas are unnecessary. Existing photomasking technology can be utilized on very small gates without creating a short between the gate and the source or drain. The process also produces ohmic polysilicon sources, drains, and interconnect patterns that can be contacted with an aluminum interconnect patterns.

The foregoing and other objects, features and advantages of the invention will be apparent from the following more particular description of the preferred embodiments of the invention as illustrated in the accompanying drawings.

BRIEF DESCRIPTION OF THE DRAWINGS

FIG. 1 is a cross section of a portion of a wafer showing a gate oxide and substrate structure fabricated in accordance with existing silicon gate MOSFET fabrication techniques;

FIG. 2 illustrates the step of etching to remove portions of the gate oxide to expose the substrate for subsequent deposition steps;

FIG. 3 illustrates the step of depositing polysilicon and silicon nitride layers to expose the substrate;

FIG. 4 illustrates the step of etching the polysilicon and silicon nitride layers to expose the substrate;

FIG. 5 illustrates the step of etching the gate oxide exposed by the silicon nitride and polysilicon etching step of FIG. 4 to provide automatic gate alignment;

FIG. 6 illustrates the step of predeposition of an N-type dopant;

FIG. 7 illustrates the step of regrowing a silicon oxide protective layer;

FIG. 8 illustrates the removal of silicon nitride and the deposition of phosphosilicate glass; and FIG. 9 illustrates the opening of phosphosilicate glass to expose areas for contact and the subsequent metallization step.

DESCRIPTION OF THE INVENTION

Referring now to FIGS. 1-9, the method of manufacturing a MOSFET in accordance with the method of the present invention will be described. The following description relates to the fabrication of n-channel devices but it should be understood that one having ordinary skill in the art can easily adapt the process to the fabrication of p-channel devices, or a combination of both, i.e., CMOS. The drawing shows the fabrication of a single n-channel silicon gate transistor. In actual practice, such a device occupies only a tiny fraction of a wafer being processed. Such a wafer usually contains many integrated circuits, each one of which includes many such transistors and possibly other circuit elements. The drawing is not to scale. The vertical dimension has been expanded where needed relative to the horizontal in order to clearly show the structure.

Referring to FIG. 1, there is shown a structure which is part of a semiconductor wafer and which has been fabricated up to and including the step of gate oxidation using well-known conventional silicon gate manufacturing methods. The structure includes a p-substrate 10, a thick silicon oxide layer 12, and thin gate oxide layer 16. The gate oxide 16 actually represents a dimple or thinned region contiguous with oxide layer 12. In FIG. 2, portions of the gate oxide layer 16 are photolithographically etched away to expose the substrate at 13 and 14 to subsequent predeposition. Next, FIG. 3, a layer of polysilicon 18 is deposited over the entire surface. Immediately after the polysilicon deposition, and desirably in the same deposition chamber, a silicon nitride layer 24, having a thickness of about 1000A or less, is deposited over the structure. In FIG. 4, a photolithographic mask is used to selectively etch the nitride layer 24 and, using the same photolithographic mask or the nitride itself as a mask, the polysilicon layer is then etched away as shown. This operation leaves two polysilicon islands isolated and capped with silicon nitride. Island 20 is located on top of gate oxide 16. The other island 22 is adjacent to the gate oxide and is in contact with substrate 10. A contact portion 23 is also left with its silicon nitride cap. This contact 23 is in direct contact with the substrate and rides up on top of oxide layer 12.

Referring to FIG. 5, the silicon nitride layer is now used as a mask in an etch process which etches the exposed gate oxide 16, leaving substrate areas 30, 32, 34 open to subsequent steps. The gate oxide 16 is now in precise alignment with polysilicon gate 20.

Referring to FIG. 5, the silicon nitride layer is now used as a mask in an etch process which etches the exposed gate oxide 16, leaving substrate areas 30, 32, 34 open to subsequent steps. The gate oxide 16 is now in precise alignment with polysilicon gate 20.

Referring to FIG. 6, the nitride/silicon-dioxide sandwich is used as a diffusion mask against a phosphorous, arsenic or other n-type dopant predeposition onto the exposed silicon substrate areas 30, 32, 34. This creates doped regions 30a, 32a and 34a.

The phosphorous glass created by the predeposition step is removed and oxide is then regrown over the exposed areas which were previously predeposited. The initial nitride thickness is chosen such that after phosphorous predeposition and glass removal there is still about 600-700A of silicon nitride left. No oxide will grow on the top of the polysilicon layer because it is still protected by the silicon nitride layer 24. About 5000A of the oxide is grown as shown if FIG. 7. This brings the oxide surface 42, 44, 46 approximately level with the top of the polysilicon. During the oxide growth the n-type predeposit diffuses into the substrate to create regions 36, 38, and 40. These regions penetrate into substrate 10 and also extend slightly under the oxide that originally localized the predeposit.

The exposed silicon nitride is then removed by chemical etching. A phosphorous doped silicate glass (PSG) layer 48 is then deposited over the wafer. Next, the wafer is subjected to an anneal/flow heat cycle. During this heat cycle, the exposed polysilicon which has up to this point been undoped becomes heavily doped with phosphorus originating from the phosphorous doped glass, and therefore highly conductive. The anneal/flow cycle not only getters both the ionic impurities from the grown oxide and certain metallic impurities from the silicon, the PSG layer 48 becomes liquid and flows to create a smooth surface geometry as illustrated in FIG. 8.

In addition to doping the polysilicon, the phosphorous will diffuse through the polysilicon and into substrate 10 where it is in direct contact. This acts to dope the substrate at regions 37 and 39. The gate oxide 16 prevents substrate doping from polysilicon gate 20. Thus diffused contact 36 is ohmically connected to polysilicon 23 by way of diffused region 37. Diffused contacts 38 and 40 are connected together by diffusion 39 and are therefore in ohmic contact with polysilicon 22.

It can be seen that silicon gate 20 is located over gate oxide 16 which extends to cover a channel region extending between source and drain electrodes 36 and 38. Polysilicon layers 23 and 22 are in ohmic conductive contact with the source and drain electrodes so that, if desired, subsequent metal contacts need to be made only to polysilicon material.

As shown in FIG. 9, contact cuts are photolithographically etched in the PSG layer 48 over polysilicon layers 20 and 22. The wafer is then coated with contact metal which is then etched back to create metal contacts 49 and 50 in the conventional manner. While not shown, polysilicon layer 23 can be similarly contacted elsewhere on the surface of the wafer. It can be seen that the contacts to the polysilicon do not have to be precisely aligned. If there is a contact offset, no harm is done because the grown oxide will prevent shorting.

The above described process makes metal contact entirely through the PSG layer, which makes contact etching easy. Since PSG etches more rapidly than grown oxides, any contact cut offset that extends over the grown oxide is automatically prevented from penetrating. In addition, the metal contacts touch only polysilicon, and not substrate or single crystal silicon. This eases the contact metal requirements. In NMOS processing where a metal is to come into contact with crystalline silicon, an alloy is normally used. Typically aluminum with a small controlled percentage (about 2%) of silicon is deposited. When the process of the invention is used, ordinary aluminum can be used and the metal deposition is made easier to accomplish and control.

Even though the above described process is preferred, direct contact to diffused regions 36 and 38 can be accomplished by etching through both the PSG and grown oxide layers. In this event, conventional NMOS metallization would be employed.

While the invention has been particularly shown and described with reference to preferred embodiments thereof, it will be understood by those skilled in the art that various changes in form and detail may be made therein without departing from the spirit and scope of the invention.

I claim:

1. The method of preparing a partially fabricated integrated semiconductor device structure for deposition of metal contacts to selected areas thereof, the semiconductor substrate of said structure being of a first conductivity type and having thereon regions of relatively thick oxide, regions of relatively thin oxide suitable for providing the gate insulator function of an insulated gate field effect transistor, regions adjacent said thin oxide regions where no oxide is present, and an overcoating of polysilicon, whereby said polysilicon contacts said substrate in said regions where no oxide is present, said method comprising the steps of:

depositing a protective layer of silicon nitride over said polysilicon overcoating;

defining a gate and interconnect pattern in said silicon nitride layer:

defining said gate and interconnect pattern in said polysilicon overcoating;

etching exposed portions of said thin oxide away, using said silicon nitride as a mask to confine said thin oxide to exactly the contour of said gate polysilicon;

predepositing an impurity, of a conductivity type opposite to that of said substrate, on the exposed regions of said substrate;

growing an oxide over said exposed regions of said substrate and simultaneously diffusing said predeposited impurity into said substrate to produce transistor source and drain electrodes;

removing said silicon nitride layer to expose said polysilicon;

depositing a glass layer having a melting temperature below that of silicon dioxide and containing an oxide of an impurity that will dope silicon to a conductivity type opposite to that of said substrate;

heating said structure to cause said deposited glass to flow thereby to establish a smooth surface thereon and to dope the underlying polysilicon and associated portions of said substrate whereby said polysilicon becomes conductive and in ohmic contact with those portions of said substrate that do not have an intervening layer of oxide; and establishing metal contacts to said polysilicon by way of openings established in said deposited glass layer.

2. The method of claim 1 wherein the step of defining said silicon nitride employs a photolithographic mask and the same mask is used to define said polysilicon.

3. The method of claim 1 wherein said substrate is p-type and said deposited glass is a phosphosilicate glass.

4. The method of claim 2 wherein said silicon nitride acts as the mask used to define said polysilicon.

5. The device fabricated in accordance with claim 1.

* * * * *